United States Patent [19]
Ueno et al.

[11] Patent Number: 5,512,853
[45] Date of Patent: Apr. 30, 1996

[54] INTERFACE CIRCUIT ADAPTIVE TO HIGH SPEED AND LOW VOLTAGE OPERATION

[75] Inventors: Norio Ueno, Kawasaki; Toru Matsuyama, Sapporo, both of Japan

[73] Assignee: Fujitsu Limited, Kanagawa, Japan

[21] Appl. No.: 320,068

[22] Filed: Oct. 7, 1994

[30] Foreign Application Priority Data

Mar. 17, 1994 [JP] Japan ................................ 6-047490

[51] Int. Cl.⁶ ........................ H03L 5/00; H03K 17/16; H03B 1/00; H01L 25/00
[52] U.S. Cl. ........................ 327/333; 327/108; 327/379; 327/389; 327/564; 327/565; 327/566; 326/21; 326/23
[58] Field of Search ........................ 327/333, 560, 327/561, 562, 563, 564, 108, 379, 389, 566, 565; 455/608; 326/21, 23

[56] References Cited

U.S. PATENT DOCUMENTS

4,481,676 11/1984 Eumurian et al. ........................ 455/608
4,694,504 9/1987 Porter et al. ........................ 455/608

*Primary Examiner*—David C. Nelms
*Assistant Examiner*—Trong Phan

[57] ABSTRACT

An interface circuit for interfacing between an integrated circuit (IC) on a transmitting side and an IC on a receiving side over a line on a printed circuit board comprises an output circuit implemented in the IC on the transmitting side and composed of a current source for supplying a given current and a switching circuit for cutting off the given current according to a binary signal and delivering the given current as a current signal to the line, and an input circuit implemented in the IC on the receiving side and composed of a transimpedance circuit whose input impedance is equal to the one of the line and which converts the current signal into a voltage signal, and a comparator for identifying the voltage signal relative to a given threshold voltage and reproducing the binary signal. This circuitry makes it possible to provide an interface circuit that can be implemented in a CMOS IC during CMOS processing and operated at a low voltage. A threshold voltage for use in identifying a signal on the receiving side is stabilized, thus realizing an interface circuit unsusceptible to influence of a change in CMOS processing or the like.

7 Claims, 9 Drawing Sheets

INTERFACE CIRCUIT ADAPTIVE TO HIGH SPEED AND LOW VOLTAGE OPERATION

BACKGROUND OF THE INVENTION

1. Field of the Invention

The present invention relates to an art for interfacing a signal between integrated circuits. More particularly, this invention relates to an interface circuit that uses a current signal as a signal to be interfaced between integrated circuits and thus permits a high-speed operation.

2. Description of the Related Art

With an increase in the number of steps of CMOS processing, internal circuit elements of a CMOS integrated circuit (IC) have come to be able to operate at several hundreds of megahertz (MHz). However, an interface circuit provided as an input/output circuit cannot operate at a high speed. This hinders high-speed operation of an entire CMOS IC.

An interface circuit for a CMOS IC is therefore requested to operate at a high speed so that a function realized with the CMOS IC can cope with quick operations of the internal circuit elements.

Conventionally, a CMOS IC has had a lower operation speed than a bipolar IC or a gallium arsenide (GaAs) IC. In recent years, with an increase in the number of steps of CMOS processing, circuit elements of an IC have come to be able to operate at several hundreds of megahertz.

However, an interface circuit cannot input or output a high-speed signal due to a parasitic capacitance in a protective circuit usually included in an input or output unit in a CMOS IC and designed to prevent electrostatic destruction (ESD) or in a bonding pad.

Figure 1A:
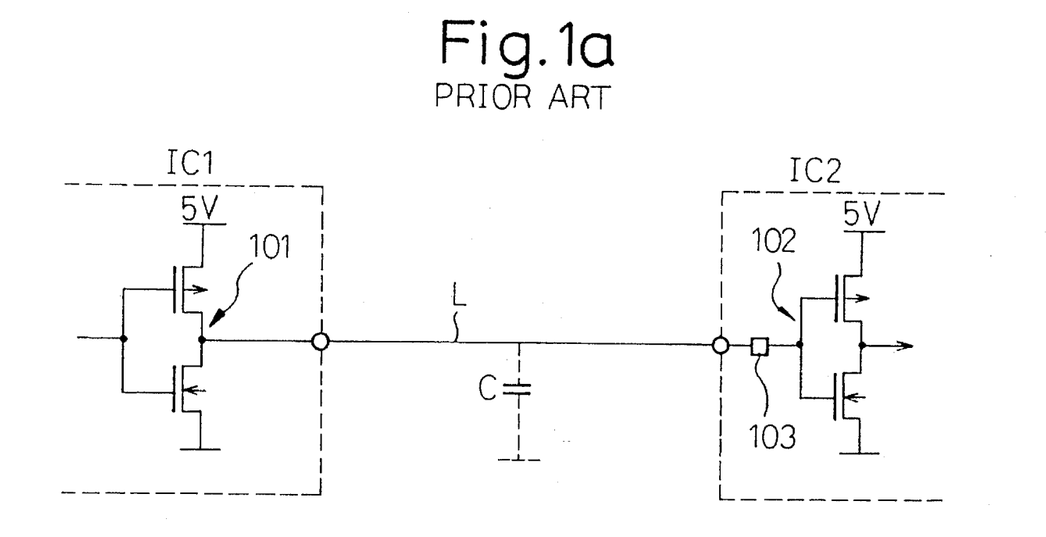
FIGS. 1a and 1b show a CMOS interface circuit in accordance with an example of a prior art.
Figure 1B:
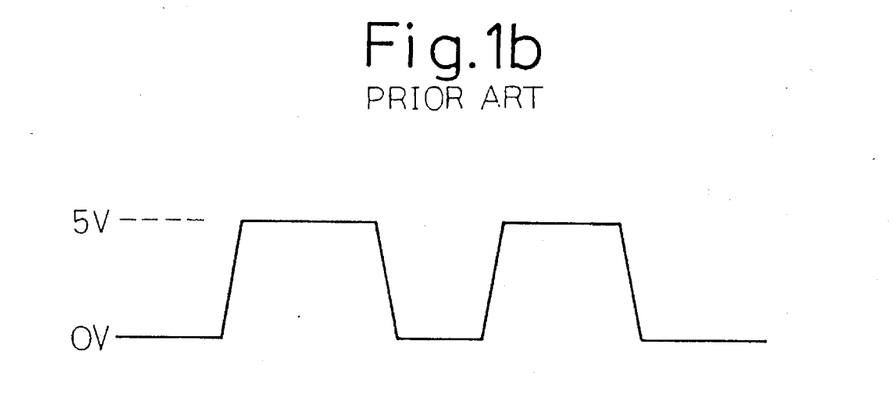

FIG. 1a shows circuit elements of a CMOS interface circuit in accordance with an example of a prior art. FIG. 1b shows waves of an input/output signal for the circuit.

In FIG. 1a, IC1 denotes a CMOS IC on a transmitting side. 101 denotes an output buffer incorporated in IC1. IC2 denotes a CMOS IC on a receiving side. 102 denotes an input buffer incorporated in IC2. L denotes a line on a printed circuit board for linking IC1 and IC2. 103 denotes a counter-ESD protective circuit connected to an input terminal of IC2 over the line L on the printed circuit board. The line L and the counter-ESD protective circuit 103 possess a parasitic capacitance C of about 10 pF as a whole, which is a cause of preventing input or output of a high-speed signal.

A conventional mainstream of a high-speed interface circuit is a bipolar ECL interface. Using an ECL interface, a CMOS IC can operate as high a speed as, for example, about 100 MHz. However, the ECL interface has a drawback of a large power consumption.

An interface circuit in an IC serving as a memory or a microprocessor is sometimes required to provide interface for 32-bit parallel operation. In this case, the power consumption of the interface circuit in an input or output unit is large, causing a chip temperature to rise and reliability to degrade. This disables high-speed operation.

On the other hand, an existing IC serving as a microprocessor or the like typically operates at a supply voltage of +5 V. A future trend heads toward operation at a low voltage (for example, +3 V). In this case, it is economic to use a single power supply for all circuit elements in a printed circuit board. Consequently, there arises a demand for an interface circuit capable of operating at a lower voltage.

As mentioned above, when an interface circuit for a CMOS IC is requested to operate at a high speed, an ECL interface must be employed. This leads to a large power consumption and a high price. In contrast, when a highly economical CMOS processing method is adopted, high-speed operation cannot be realized.

In line with a trend toward operation at a lower voltage, an interface circuit capable of operating at a low voltage is needed. Known prior arts have failed to implement such an interface circuit.

SUMMARY OF THE INVENTION

An object of the present invention is to realize an interface circuit for a CMOS IC during CMOS processing and to provide an interface circuit capable of operating at a low voltage.

Another object of the present invention is to realize an interface circuit unsusceptible to influence of a change in CMOS processing or the like by stabilizing a threshold voltage for use in identifying a signal on a receiving side.

According to a first aspect of the present invention, there is provided an interface circuit for interfacing between an integrated circuit on a transmitting side and an IC on a receiving side over a line on a printed circuit board, comprising: an output circuit implemented in the IC on the transmitting side and composed of a current source for supplying a given current and a switching circuit for cutting off the given current according to a binary signal and delivering the given current as a current signal to the line; and an input circuit implemented in the IC on the receiving side and composed of a transimpedance circuit whose input impedance is equal to the one of the line and which converts the current signal into a voltage signal, and a comparator for identifying the voltage signal relative to a given threshold voltage and reproducing the binary signal.

Also, according to a second aspect of the present invention, there is provided an interface circuit for interfacing between an integrated circuit on a transmitting side and an IC on a receiving side over a first line on a printed circuit board and a second line thereof, comprising: a differential output circuit implemented in the IC on the transmitting side and composed of a current source for supplying a given current and a switching circuit for alternating the first line and the second line according to a binary signal so as to deliver the given current as a current signal; and a differential input circuit implemented in the IC on the receiving side and composed of a first transimpedance circuit whose input impedance is equal to the one of the line and which converts a current signal on the first line into a voltage signal, a second transimpedance circuit whose input impedance is equal to the one of the second line and which converts a current signal on the second line to a voltage signal, and a comparator for comparing between outputs of the first and second transimpedance circuits and reproducing the binary signal.

BRIEF DESCRIPTION OF THE DRAWINGS

Other objects and features of the present invention will be described hereinafter in detail in conjunction with preferred embodiments with reference to the accompanying drawings, in which.

DESCRIPTION OF THE PREFERRED EMBODIMENTS

Figure 2A:
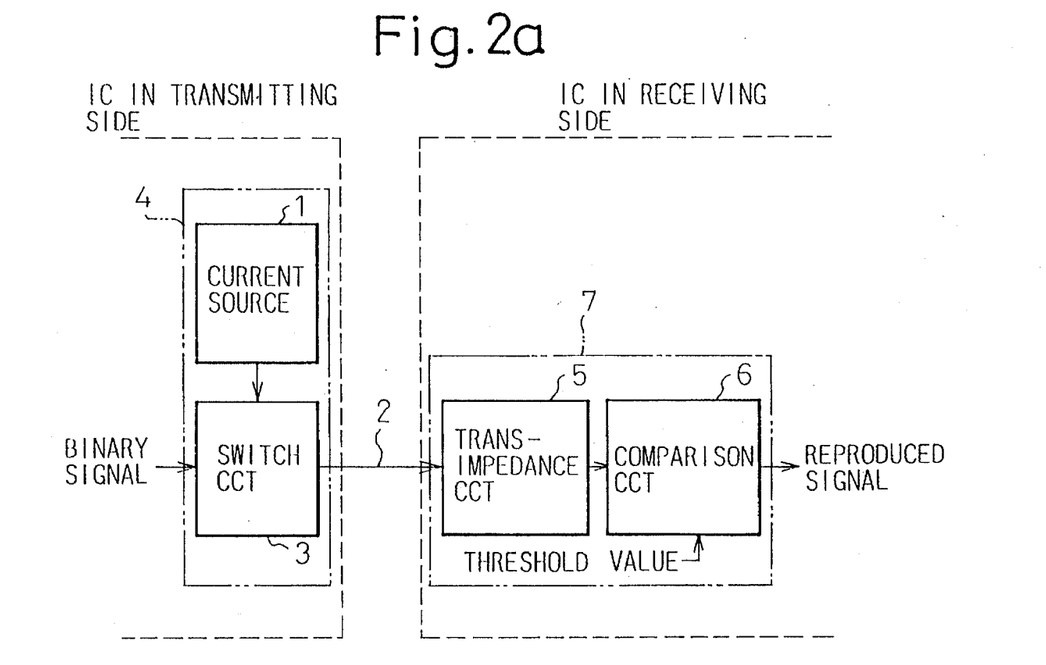
FIGS. 2a and 2b are block diagrams showing principles and configurations of interface circuits in accordance with the present invention.
Figure 2B:
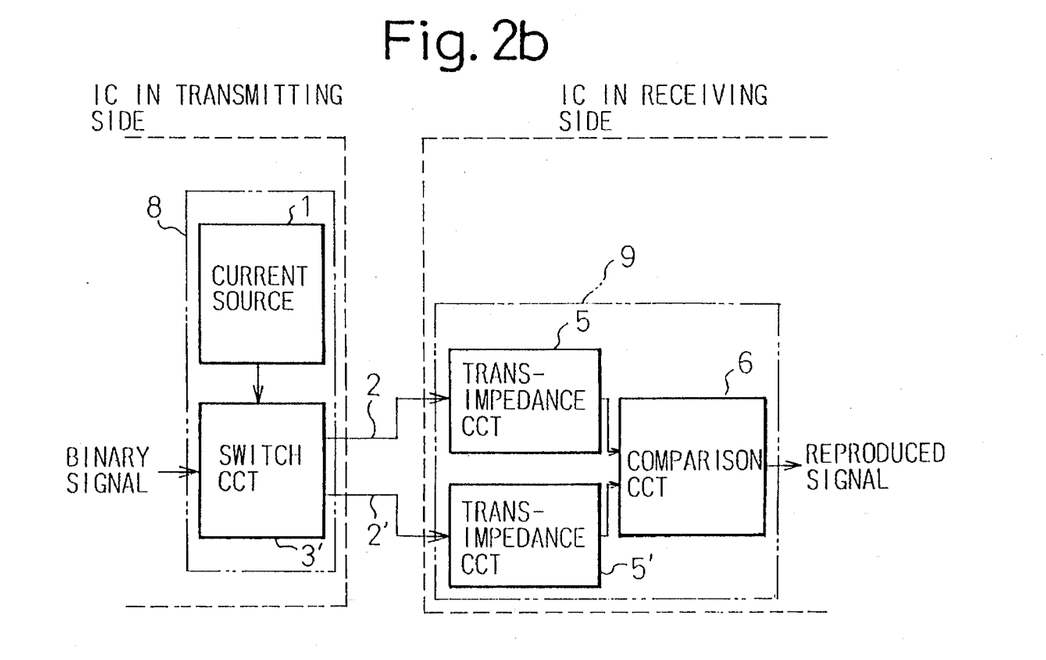

FIGS. 2a and 2b show principles and circuitries of interface circuits relating to the present invention. FIG. 2a shows an interface circuit designed for parallel transmission. FIG. 2b shows an interface circuit designed for serial transmission.

Referring to FIG. 2a, an IC on a transmitting side has an output circuit 4. The output circuit includes a current source 1 for supplying a given current and a switching circuit 3 for cutting off the given current according to a binary signal and transmitting the given current as a current signal over a line 2 on a printed circuit board.

An IC on a receiving side has an input circuit 7. The input circuit includes a transimpedance circuit 5 whose input impedance is equal to the one of the line 2 and which converts the current signal into a voltage signal, and a comparator 6 for identifying the voltage signal relative to a given threshold voltage and reproducing an original binary signal.

The output circuit 4 and input circuit 7 interface between the ICs on the transmitting and receiving sides over the line 2.

In the circuitry shown in FIG. 2a, a binary signal is interfaced in the form of a current signal. The circuitry therefore enables high-speed operation unaffected with, for example, a parasitic capacitance of a line on a printed circuit board. The high-speed operation can be attained at a low voltage. The circuitry shown in FIG. 2a is suitable for multi-bit parallel transmission.

Referring to FIG. 2b, an IC on a transmitting side has a differential output circuit 8. The differential output circuit includes a current source 1 for supplying a given current and a switching circuit 3' for delivering the given current as a current signal by alternating a first line 2 on a printed circuit board and a second line 2' according to a binary signal.

An IC on a receiving side has a differential input circuit 9. The differential input circuit includes a first transimpedance circuit 5 whose input impedance is equal to the one of the first line 2 and which converts a current signal on the first line 2 into a voltage signal, a second transimpedance circuit 5' whose input impedance is equal to the one of the second line 2' and which converts a current signal on the second line 2' into a voltage signal, and a comparator 6 for comparing between the outputs of the first and second transimpedance circuits and reproducing an original binary signal.

The differential output circuit 8 and differential input circuit 9 interface the ICs on the transmitting and receiving sides over the first and second lines 2 and 2'.

In the circuitry shown in FIG. 2b, a binary signal is interfaced in the form of a current signal. The circuitry therefore enables high-speed operation unaffected with, for example, a parasitic capacitance of a line on a printed circuit board. Moreover, the high-speed operation can be attained at a low voltage. The circuitry shown in FIG. 2b is suitable for transmission of a signal composed of one bit or a few bits.

Next, preferred embodiments of the present invention will be explained in detail with reference to FIGS. 3 to 11.

Figure 3A:
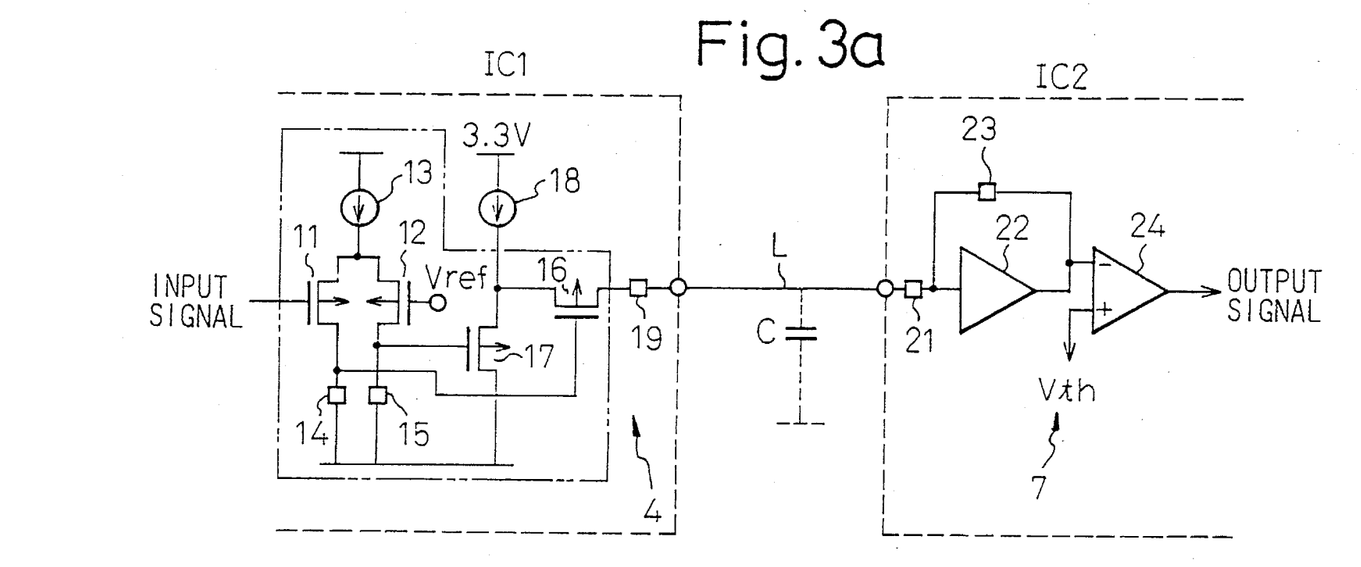
FIGS. 3a and 3b are explanatory diagrams concerning a high-speed interface circuit in accordance with the first embodiment of the present invention.
Figure 3B:
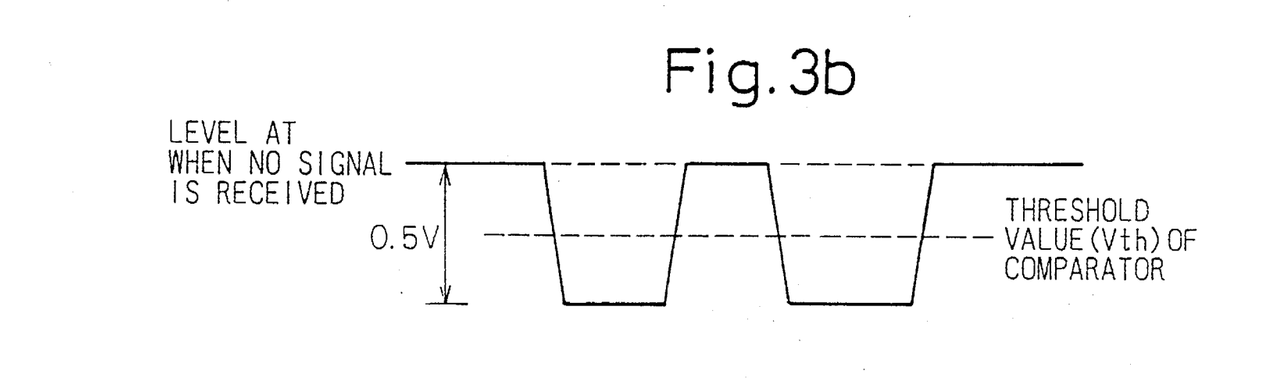

FIG. 3a shows a circuitry of a high-speed interface circuit in accordance with the first embodiment of the present invention. FIG. 3b shows a wave of a signal handled by the circuit. Circuit elements identical to those in FIGS. 1a and 1b are assigned the same reference numerals. In IC1 on the transmitting side, 11 and 12 denote differential connection transistors. Each of the transistors inputs an input signal and a reference signal Vref through the gate thereof. When supplied a constant current of, for example, 0.1 mA from the current source 13, the transistors 11 and 12 provide load resistors 14 and 15, which possess a resistance R, with output voltages. 16 and 17 denote transistors serving as analog switches. When the gates of the transistors 16 and 17 are driven by the load resistors 14 and 15, the transistors 16 and 17 are supplied, for example, 2 mA from the current source 18 over a supply voltage line of 3.3 V. The transistors 16 and 17 then allow the current of 2 mA to flow alternately into an output terminal and a ground. 19 denotes a counter-ESD protective circuit inserted to the output terminal. The current sources 13 and 18 are formed with p-channel transistors. In FIG. 3a, the circuit elements 11 to 18 constitute the switching circuit 3.

In IC2 on the receiving side, 21 denotes a counter-ESD protective circuit inserted to the input terminal. 22 denotes an amplifier in which negative feedback is effected through a resistor 23. 24 denotes a comparator for comparing an output voltage of the amplifier 22 with a threshold voltage and providing an output. In this example, a parasitic capacitance C present between the transmitting and receiving sides is provided as a sum among a capacitance of the line L on a printed circuit board and capacitances of the protective circuits 19 and 21 in the transmitting and receiving sides respectively. The parasitic capacitance C is, for example, about 10 pF. In FIG. 3a, the circuit elements 22 and 23 constitute the transimpedance circuit 5.

In the high-speed interface circuit shown in FIG. 3a, the switching circuit 3 switches destinations of a current from the current source 18 using the switches 16 and 17. Thus, when a certain current is cut off, a low-level output is generated. When the certain current is flown, a high-level output is generated. The amplifier 22 is an inverting amplifier possessing a fivefold gain at an operational frequency of 300 MHz or higher, wherein negative feedback is effected through the 250-ohm resistor 23. The amplifier 22 and resistor 23 constitute a transimpedance circuit for converting a current signal into a voltage signal. The transimpedance circuit possesses an input impedance of 50 ohms.

An intermittent current signal sent from the IC on the transmission side is fed to the input port of the amplifier. Assuming that the current signal has an amplitude of 20 mA, the amplitude of of a signal on the line L is as small as 0.1 V. An inverting amplifier possessing a fivefold gain is used as the amplitude 22. The output of the amplitude 22 is therefore, as shown in FIG. 3b, a voltage signal with an amplitude of 0.5 V.

The frequency band Fc of the high-speed interface circuit shown in FIG. 3a is determined with the total parasitic capacitance C, feedback resistance Rf, and amplifier gain G at the input port of the negative-feedback amplifier according to the formula below.

$$Fc=G/2\pi KCR$$

Assuming that the amplifier gain G is 5, the parasitic capacitance C is 10 pF, and the feedback resistance Rf is 250 ohms, the frequency band Fc is provided as follows:

Fc=318 MHz

Figure 4:
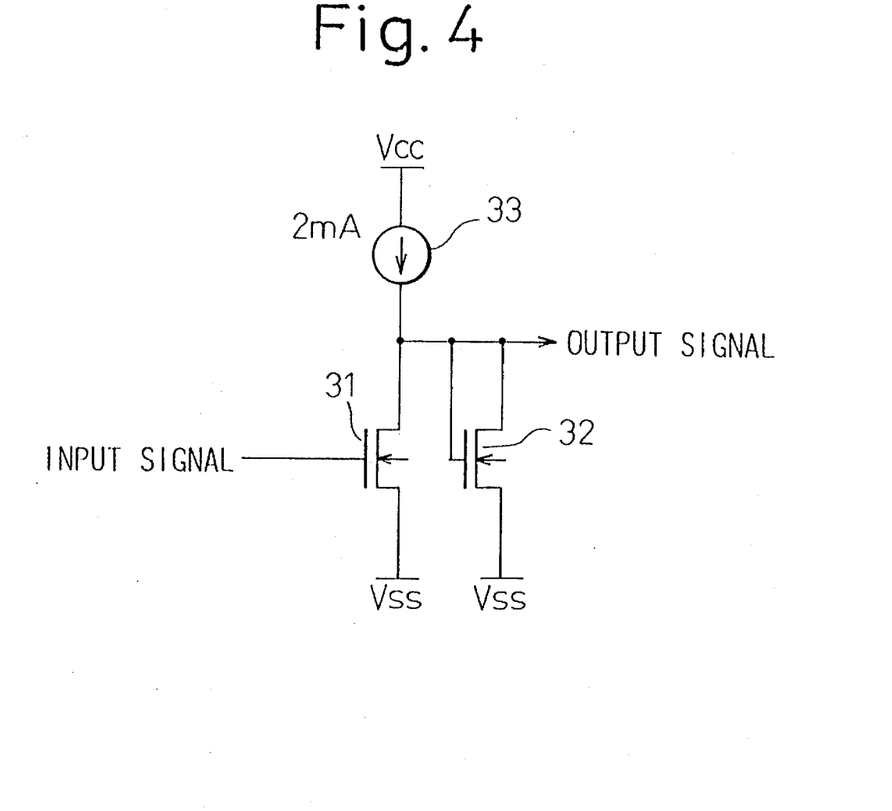
FIG. 4 shows an example of circuit elements of an amplifier possessing a given gain.

FIG. 4 shows an example of circuit elements of an amplifier possessing a given gain; that is, an inverting amplifier possessing a fivefold gain. 31 and 32 denote N-channel transistors. 33 denotes a current source supplying a constant current of, for example, 2 mA and being formed with a p-channel transistor.

In the amplifier shown in FIG. 4, assuming that the channel widths of the transistors 31 and 32 are W1 and W2 respectively, when a W1 value is five times as large as a W2 value, the gain G is provided as W1/W2=5.

Figure 5:
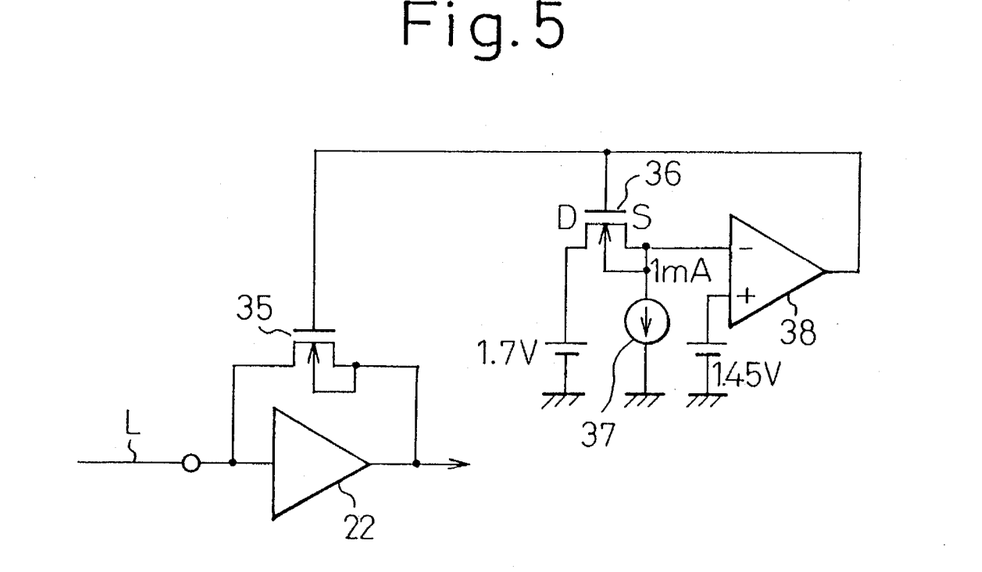
FIG. 5 shows an example of a feedback resistor for a transimpedance circuit.

FIG. 5 shows an example of circuit elements of a feedback resistor for a transimpedance circuit. The feedback resistor is implemented through CMOS processing. Circuit elements identical to those in FIG. 3a bear the same reference numerals. 35 denotes a transistor serving as a feedback resistor. 36 denotes a transistor that is of the same size as the transistor 35. 37 denotes a current source of, for example, 1 mA. 38 denotes an operational amplifier.

In general, semiconductor resistors formed through processing of semiconductors are greatly different from one another. Their degrees of accuracy cannot help differing from one another within ±30%. However, as shown in FIG. 5, the transistor 35 is used as a negative feedback resistor for a transimpedance circuit. Voltages comparable to drain and source voltages of the transistor 35 are applied falsely to the transistor 36 that is of the same size as the transistor 35, whereby a given current is fed forcibly to the transistor 36. A voltage equivalent to the gate voltage of the transistor 36 is then applied to the transistor 35, thus realizing a given resistance.

In FIG. 5, an output port of the operational amplifier 38 is connected to the gate of the transistor 36. A voltage equivalent to a source voltage of the transistor 35 is applied to a non-inverting input port of the operational amplifier 38. An inverting input port of the operational amplifier 38 is connected to the source of the transistor 36. A voltage equivalent to the drain voltage of the transistor 35 is applied to the drain of the transistor 36.

For example, when the drain voltage of the transistor 36 is 1.7 V and the source voltage thereof is 1.45 v, the drain-source voltage is 250 mV. In this state, if a current of 1 mA is supplied from the current source 37, a negative feedback resistance provided as the expression below can be realized.

Rf=(1.7−1.45)/0.001=250 (ohms)

At this time, the gate voltage of the transistor 36 has a level permitting the resistance 250 ohms. When a voltage comparable to the gate voltage is applied to the gate of the transistor 35, the transistor 35 operates as a 250 ohm resistor. Using the circuitry shown in FIG. 5 as a transimpedance circuit, an interface circuit in an IC can be terminated with an impedance equivalent to the one (50 ohms) of a line on a printed circuit board.

Figure 6:
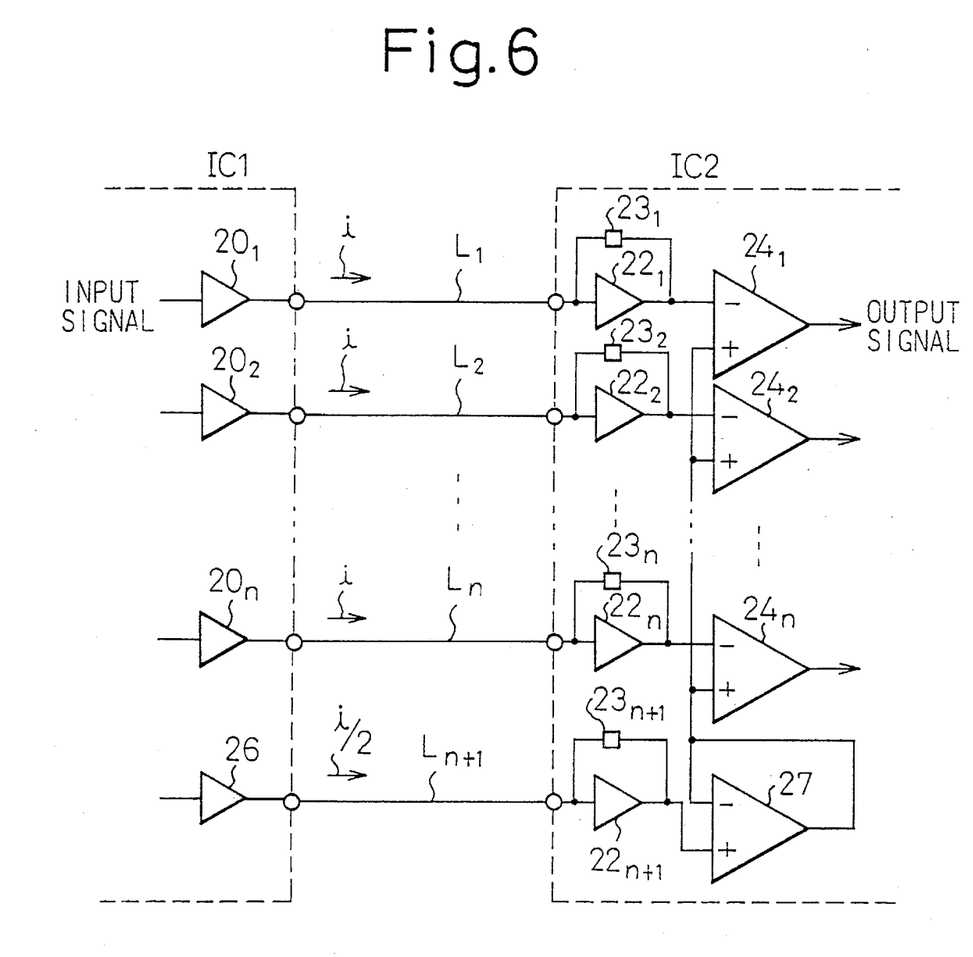
FIG. 6 is an explanatory diagram concerning a high-speed interface circuit in accordance with the second embodiment of the present invention.

FIG. 6 shows a circuitry of a high-speed interface circuit in accordance with the second embodiment of the present invention, wherein an 8-bit, 16-bit, or 32-bit parallel interface is constructed. In IC1 on the transmitting side, $20_1$, $20_2$, etc., and $20_n$ denote output circuits each of which is identical to the one shown in FIG. 3a. 26 denotes an output circuit for threshold current generation. In IC2 on a receiving side, $22_1$, $22_2$, etc., $22_n$, and $22_{n+1}$ denote amplifiers each of which is identical to the one shown in FIG. 3a. $23_1$, $23_2$, etc., $23_n$, and $23_{n+1}$ denote negative feedback resistors each of which is identical to the one shown in FIG. 3a. $24_1$, $24_2$, etc., and $24_n$ denote comparators each of which is identical to the one shown in FIG. 2a. 27 denotes an amplifier serving as a threshold voltage feeding circuit. $L_1$, $L_2$, etc., $L_n$, and $L_{n+1}$ denote lines on a printed circuit board.

In the second embodiments, the number of high-speed interface circuits, each of which is shown in FIG. 3a and has transmitting and receiving sides opposed to each other, is n (n=8, 16, or 32). In each interface circuit, a current i conveys a signal from an output circuit on a transmitting side to an input circuit on a receiving side. At this time, a threshold voltage of a comparator for extracting a slice of an input to the next stage should be set to a mean level of an amplitude of a wave shown in FIG. 3b. This is intended to suppress a variation in pulse duration of an output of the comparator serving as a slicer.

The output circuit 26 for threshold current generation on the transmitting side generates an output current i/2 that is a half in magnitude of a sum of output currents i of the output circuits $20_1$, $20_2$, etc., and $20_n$. The amplifier $22_{n+1}$ on the receiving side converts the output current i/2 into a voltage that is a half in level of a sum of output voltages of the amplifiers $22_1$, $22_2$, etc., and $22_n$. The threshold voltage feeding circuit 27 feeds the voltage as a threshold voltage for use in extracting a slice of an input voltage (or identifying an input voltage) to each of the comparators $24_1$, $24_2$, etc., and $24_n$.

According to the embodiment shown in FIG. 6, all transmitting/receiving circuits have the same circuitry. A signal is transmitted using the same current. The same received voltage is generated, which is identified through comparison with a threshold voltage whose level is a half of that of a received voltage. Thus, an input for actuating the next stage is obtained. Consequently, a signal composed of a plurality of bits can be interfaced without causing any error.

Figure 7A:
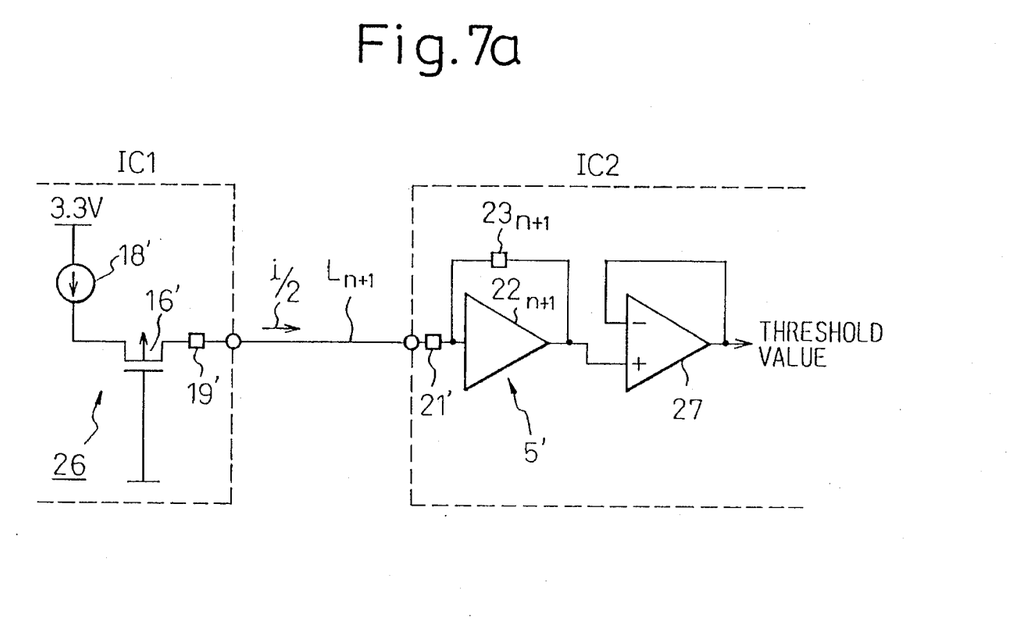
FIGS. 7a and 7b show an example of circuit elements of a threshold setting circuit.
Figure 7B:
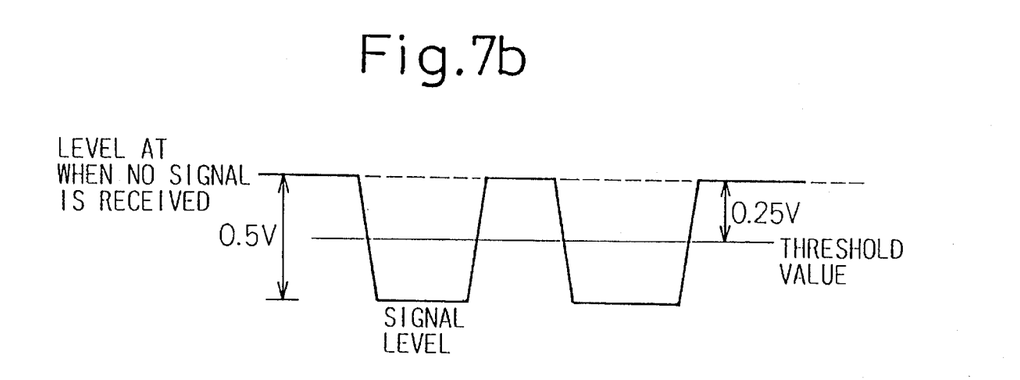

FIG. 7a shows an example of circuit elements of a threshold setting circuit. FIG. 7b shows a relationship between a signal wave and a threshold voltage in the circuit. Circuit elements identical to those in FIG. 6 are assigned the same reference numerals. In IC1 on the transmitting side, a current source 18' supplies a current of 1 mA at a supply voltage 3.3 V. A transistor 16' serving as an analog switch has the gate thereof grounded, and delivers a current of 1 mA (i/2) to a line $L_{n+1}$ on a printed circuit board via a protective circuit 19'.

In IC2 on the receiving side, an amplifier $22_{n+1}$ is a inverting amplifier possessing a fivefold gain and is identical to an amplifier for signal reception. In the amplifier $22_{n+1}$, negative feedback is effected through a 250 ohm resistor $23_{n+1}$. On receipt of the i/2 current via a protective circuit 21', the amplifier $22_{n+1}$ generates a voltage of 0.25 V as an output. The threshold voltage feeding circuit 27 feeds the voltage as a threshold voltage to the associated comparator.

According to the threshold setting circuit shown in FIG. 7a, in response to an input signal of 0.5 V sent from each amplifier for signal reception, each comparator generates a voltage, which is 0.25 V lower than a level generated without receiving a signal, as a threshold voltage. An output voltage of each signal reception amplifier can be identified with its mean level or a level close to the mean level. Interface is therefore unsusceptible to any change in CMOS processing but remains stable.

When the number of signals is small or only one signal is to be interfaced, the transmitting side does not transmit threshold voltage information. A large current for conveying a signal is flown on the transmitting side, so that a received signal whose level is the largest within a predetermined threshold voltage can be obtained on the receiving side. Thus, influence of a change in processing may be avoided.

Figure 8:
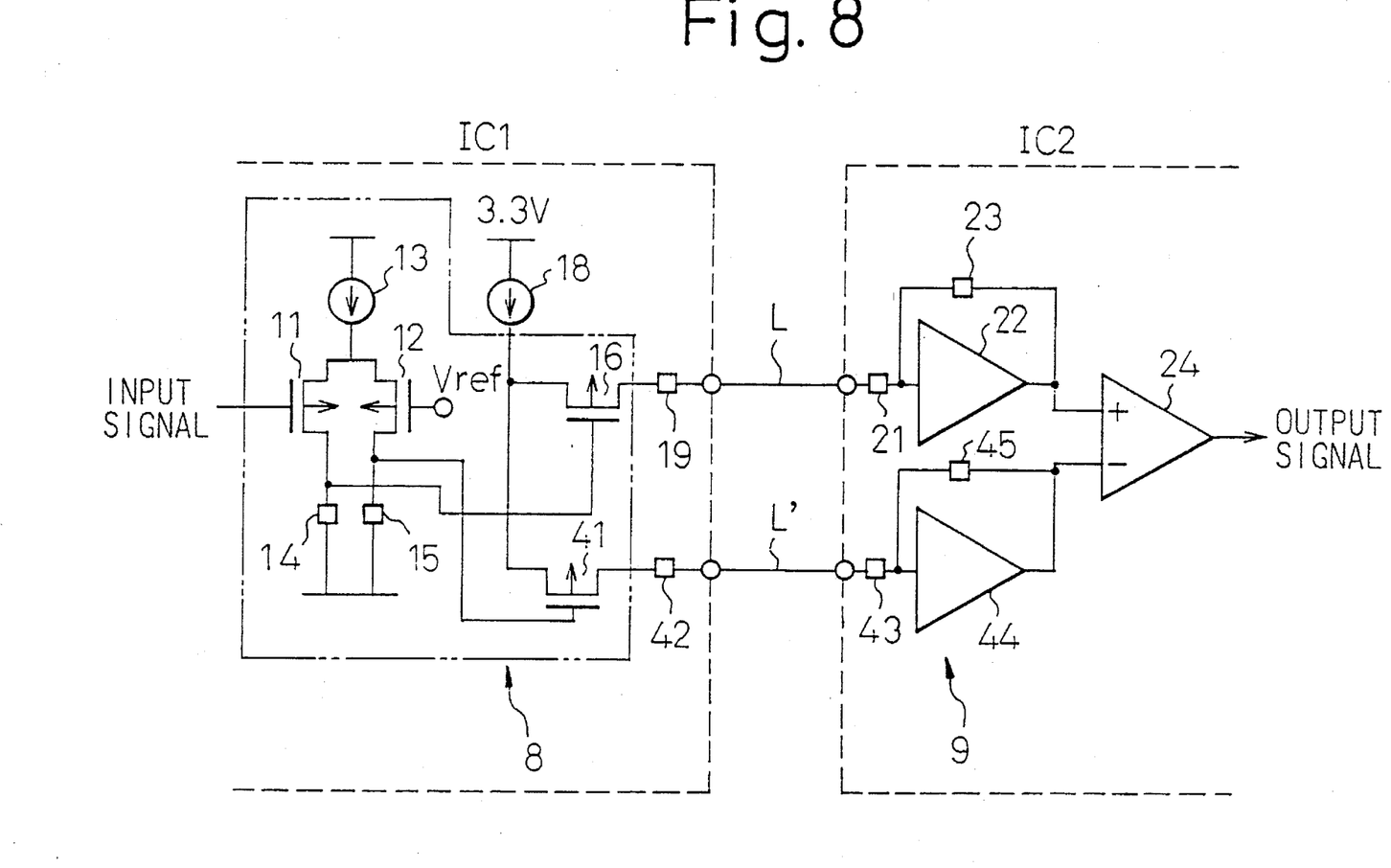
FIG. 8 is an explanatory diagram concerning a high-speed interface circuit in accordance with the third embodiment of the present invention.

FIG. 8 shows a circuitry of a high-speed interface circuit in accordance with the third embodiment of the present invention. The high-speed interface circuit is another example of an interface circuit applicable to transmission and reception of only one signal, wherein a differential signal transmitting/receiving circuit is employed. Circuit elements identical those in FIG. 3a bear the same reference numerals. 41 denotes a transistor serving as a switch. 42 denotes a protective circuit on the transmitting side. 43 denotes a protective circuit on the receiving side. 44 denotes an inverting amplifier possessing a fivefold gain. 45 denotes a 250 ohm negative feedback resistor. In FIG. 8, the circuit elements 11 to 16 and 41 constitute a switching circuit. The amplifier 44 and negative feedback resistor 45 constitute a transimpedance circuit 5'.

On the transmitting side, the transistors 11 and 12 are alternately turned on in response to an input signal. The transistors 16 and 41 serving as analog switches are then turned on alternately. The switching circuit 3' feeds a current of 2 mA alternately to lines L and L' on a printed circuit board. The amplifiers 22 and 44 constituting a transimpedance circuit alternately generate an output of 0.5 V. The comparator 24 identifies the output and provides a reproduced signal.

According to the circuitry shown in FIG. 8, a high-speed interface circuit, which transmits only one signal to a receiving side using a current as an interface signal and is unsusceptible to influence of a change in CMOS processing of the like, can be implemented easily. Furthermore, a power consumption is not very large.

Figure 9:
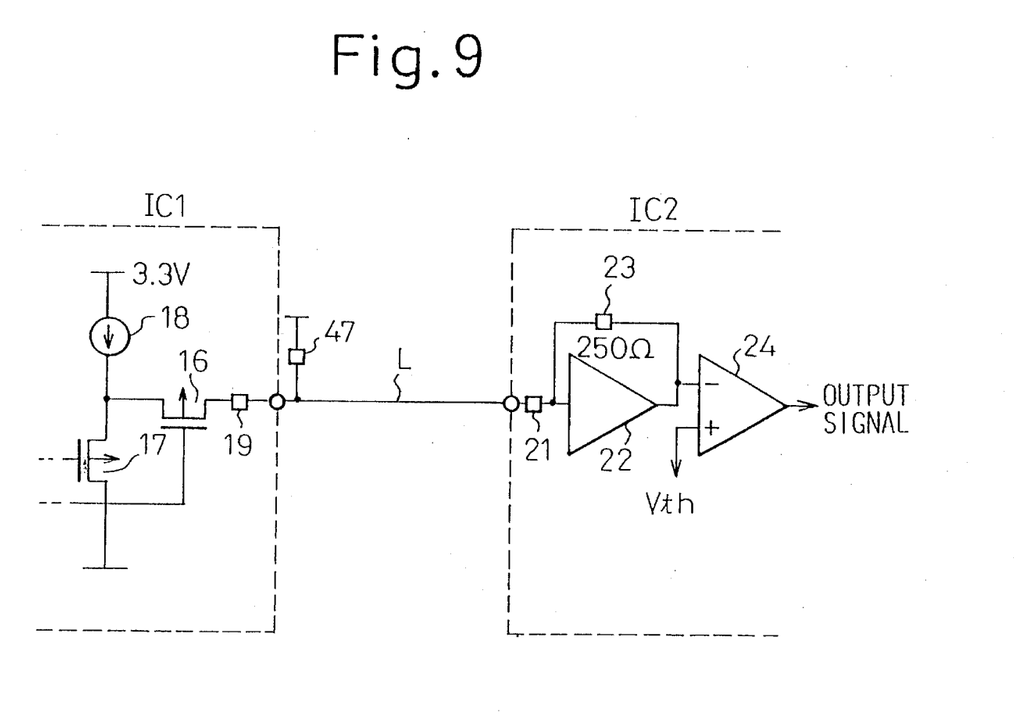
FIG. 9 is an explanatory diagram concerning a high-speed interface circuit in accordance with the fourth embodiment of the present invention.

FIG. 9 shows a circuitry of a high-speed interface circuit in accordance with the fourth embodiment of the present invention. Impedance matching is performed even on a transmitting side, thus preventing multiple reflection. Circuit elements identical to those in FIG. 3a are assigned the same reference numerals. 47 denotes a 50 ohm terminal resistor.

In the embodiment shown in FIG. 9, reflection occurs because the protective circuit 21 is inserted to the terminal of the line L, of which line impedance is 50 ohms, on the receiving side. The reflection is absorbed by means of the terminal resistor 47 connected to the terminal of the line L on the transmitting side. Thus, multiple reflection is prevented.

Alternatively, a transimpedance circuit shown in FIG. 5 may be constructed on the transmitting side in order to form a terminal resistor, whereby impedance match may be attained. In addition, transmission and reception buffers may be constructed.

Figure 10:
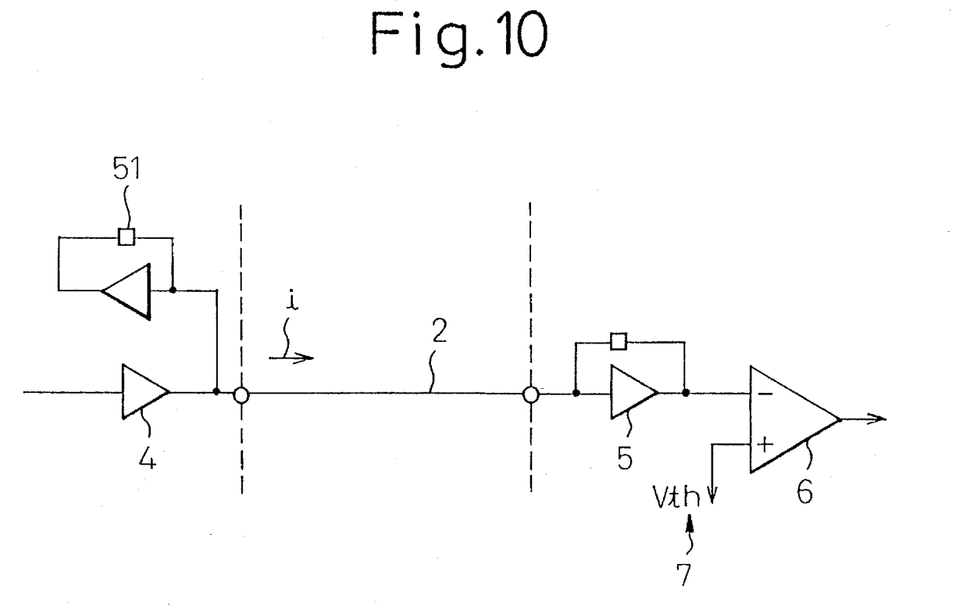
FIG. 10 is an explanatory diagram concerning a high-speed interface circuit in accordance with the fifth embodiment of the present invention.

FIG. 10 shows a circuitry of a high-speed interface circuit in accordance with the fifth embodiment of the present invention. Circuit elements identical to those in FIG. 3a are assigned the same reference numerals. 51 denotes an impedance matching circuit.

In FIG. 10, a signal interface circuit comprises an output circuit 4 including a current source for supplying a given current and a switching circuit for cutting off the current according to a binary signal and delivering the current as a current signal i to a line 2 on a printed circuit board, and an input circuit 7 including a transimpedance circuit 5 whose input impedance is equal to the one of the line 2 and which converts an input current signal into a voltage signal, and a comparator 6 for identifying the voltage signal relative to a given threshold voltage and reproducing an original binary signal. A protective circuit is not illustrated.

The impedance matching circuit 51 has the same circuit elements as the transimpedance circuit 5 for performing impedance matching in the input circuit 7, and is connected to an output terminal of the output circuit 4.

According to the embodiment shown in FIG. 10, impedance match can be attained between the output terminal of the signal interface circuit and the line 2. This embodiment can apply to the circuitry of a differential signal transmitting/receiving circuit shown in FIG. 8.

Figure 11:
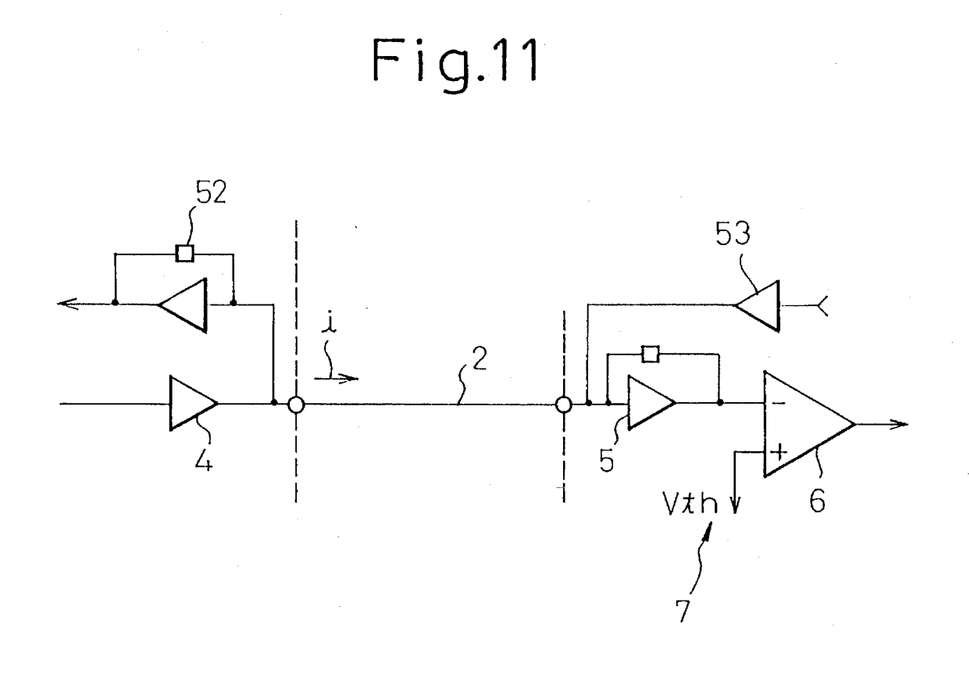
FIG. 11 is an explanatory diagram concerning a high-speed interface circuit in accordance with the sixth embodiment of the present invention.

FIG. 11 shows a circuitry of a high-speed interface circuit in accordance with the sixth embodiment of the present invention. Circuit elements identical to those in FIG. 3a are assigned the same reference numerals. 52 denotes an input buffer. In FIG. 11, a signal interface circuit comprises an output circuit 4 including a current source for supplying a given current and a switching circuit for cutting off the current according to a binary signal and delivering the current as a current signal i to a line 2 on a printed circuit board, and an input circuit 7 including a transimpedance circuit 5 whose input impedance is equal to the one of the line 2 and which converts an input current signal into a voltage signal, and a comparator 6 for identifying the voltage signal relative to a given threshold voltage and reproducing an original binary signal. A protective circuit is not illustrated.

The input buffer 52 has the same circuit elements as the transimpedance circuit 5 for performing impedance matching in the input circuit 7 and connected to the output terminal of the output circuit 4. A current signal on the line 2 can be converted into a voltage signal, and the voltage signal can be fetched from the output port of the input buffer 52. An output buffer 53 has the same circuit elements as the output circuit 4, and is connected to the input terminal of the input circuit 7. Through the output buffer 53, a current is flown into the line 2. According to the embodiment shown in FIG. 11, a circuit equivalent to the transimpedance circuit 5 is connected in parallel with the output terminal of the signal interface circuit. Thus, input and output buffers are constructed. This enables bi-directional signal transmission through the output terminal. This embodiment can apply to the circuitry of a differential signal transmitting/receiving circuit shown in FIG. 8.

As described so far, according to the present invention, an interface circuit capable of operating in a band of several megahertz can be implemented in a CMOS IC during CMOS processing. In the interface circuit of the present invention, a signal on a line on a printed circuit board has a small amplitude and therefore hardly interferes with another signal. When the interface circuit is adapted to a 32-bit bus, mutual interference between signals can be reduced.

Furthermore, a terminal whose impedance is equal to the one of a line on a printed circuit board can be implemented in an IC. Reflection that poses a critical problem in transmitting a high-speed signal can be prevented efficiently.

When it comes to an interface circuit for performing parallel transmission of a plurality of signals, signal output buffers on a transmitting side are placed mutually closely in the same chip. Even if absolute values of signal currents in a plurality of output buffers differ from one another, the relative differences among the signal currents in the output buffers can be minimized so that the signal currents have almost the same value.

By halving the size of a transistor serving as a current source, a buffer for threshold setting can be easily designed to provide a half of a signal current in a signal output buffer. Input buffers on a receiving side are placed mutually closely in the same chip. The input buffers therefore operate with the relatively same current. An input buffer for threshold setting can therefore provide a correct dc voltage whose level is approximate to a mean signal level.

A high-speed interface circuit in accordance with the present invention has the advantage of being unsusceptible to influence of a change in processing or in temperature or a fluctuation in supply voltage.

Although the present invention has been disclosed and described by way of six embodiments, it is apparent to those skilled in the art that other embodiments and modifications of the present invention are possible without departing from the essential features thereof.

What is claimed is:

1. An interface circuit for interfacing between a first integrated circuit on a transmitting side and a second integrated circuit on a receiving side over a line on a printed circuit board, comprising:

an output circuit provided on said first integrated circuit on said transmitting side and including a current source for supplying a given current, and a switching circuit for intermittently cutting off said given current according to a binary signal and delivering said intermittently cut-off current as a current signal to said line; and an input circuit provided on said second integrated circuit on said receiving side and including a transimpedance circuit whose input impedance is matched with a characteristic impedance of said line and which converts said current signal into a voltage signal, and a comparison circuit for identifying said voltage signal relative to a given threshold voltage and reproducing said binary signal, said output circuit further including an additional current source for supplying a half of a current supplied by said current source and a transistor for delivering said half of a current to said line; and said input circuit further including an additional transimpedance circuit whose input impedance is matched with a characteristic impedance of said line and which converts said half of a current into a voltage, the converted voltage determining said given threshold voltage for said comparison circuit.

2. The interface circuit according to claim 1, wherein said switching circuit includes analog switches formed with a first MOS transistor and a second MOS transistor which are alternately turned on or off according to said binary signal, the first MOS transistor delivering said given current from said current source to said line when turned on, the second MOS transistor causing said given current to flow into the ground when turned on.

3. The interface circuit according to claim 1, wherein said transimpedance circuit includes an inverting amplifier having a given gain, and a resistor means that feeds back an output signal of said inverting amplifier to an input port of said inverting amplifier and has a given resistance; and wherein said feedback allows said transimpedance circuit to have an input impedance that is matched with said characteristic impedance of said line.

4. The interface circuit according to claim 3, wherein said resistor means includes a first MOS transistor whose drain and source are connected to input and output ports, respectively, of said inverting amplifier, and a second MOS transistor whose gate is connected to a gate of said first MOS transistor, which receives the same drain voltage and source voltage as those of said first MOS transistor, and which has said given resistance that is obtained by forcibly causing a given current to flow therein.

5. The interface circuit according to claim 1, further comprising an impedance matching circuit connected to an output terminal at said output circuit and including the same circuit elements as said transimpedance circuit impedance, matching being attained between said output terminal and said line.

6. The interface circuit according to claim 1, further comprising an input buffer connected to an output terminal of said output circuit and including the same circuit elements as said transimpedance circuit, an output buffer connected to an input terminal of said input circuit, and including the same circuit elements as said output circuit.

7. An interface circuit for interfacing between a first integrated circuit on a transmitting side and a second integrated circuit on a receiving side over a first line and a second line on a printed circuit board, comprising:

a differential output circuit provided on said first integrated circuit and including a current source for supplying a given current, and a switching circuit for alternately selecting said first line and said second line according to a binary signal said given current being delivered as a current signal to a selected one of said first and second lines; and a differential input circuit provided on said second integrated circuit and including a first transimpedance circuit whose input impedance is matched with characteristic impedance of said first line and which converts a current signal on said first line into a voltage signal, a second transimpedance circuit whose input impedance is matched with a characteristic impedance of said second line and which converts a current signal on said second line into a voltage signal, and a comparison circuit for comparing the voltage signal of said first transimpedance circuit with the voltage signal of said second transimpedance circuit, thus reproducing said binary sic.

* * * * *